US006943407B2

(12) United States Patent
Ouyang et al.

(10) Patent No.: US 6,943,407 B2
(45) Date of Patent: Sep. 13, 2005

(54) LOW LEAKAGE HETEROJUNCTION VERTICAL TRANSISTORS AND HIGH PERFORMANCE DEVICES THEREOF

(75) Inventors: Qiqing Christine Ouyang, Yorktown Heights, NY (US); Jack Oon Chu, Manhasset Hills, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/463,039

(22) Filed: Jun. 17, 2003

(65) Prior Publication Data

US 2004/0256639 A1 Dec. 23, 2004

(51) Int. Cl.[7] .......................... H01L 29/76; H01L 29/94; H01L 31/062; H01L 31/113; H01L 31/119

(52) U.S. Cl. ...................... 257/329; 257/351; 438/213; 438/153

(58) Field of Search ................................ 257/328, 329, 257/330, 331, 332, 333, 334, 288, 350, 351, 369, 372; 438/213, 153

(56) References Cited

U.S. PATENT DOCUMENTS 5,936,280 A * 8/1999 Liu ............................ 257/347

* cited by examiner

Primary Examiner—B. William Baumeister
Assistant Examiner—Dana Farahani
(74) Attorney, Agent, or Firm—Scully, Scott, Murphy & Presser; Robert M. Trepp, Esq.

(57) ABSTRACT

A method for forming and the structure of a vertical channel of a field effect transistor, a field effect transistor and CMOS circuitry are described incorporating a drain, body and source region on a sidewall of a vertical single crystal semiconductor structure wherein a hetero-junction is formed between the source and body of the transistor, wherein the source region and channel are independently lattice strained with respect the body region and wherein the drain region contains a carbon doped region to prevent the diffusion of dopants (i.e., B and P) into the body. The invention reduces the problem of short channel effects such as drain induced barrier lowering and the leakage current from the source to drain regions via the hetero-junction and while independently permitting lattice strain in the channel region for increased mobility via choice of the semiconductor materials. The problem of scalability of the gate length below 100 nm is overcome by the heterojunction between the source and body regions.

28 Claims, 10 Drawing Sheets

LOW LEAKAGE HETEROJUNCTION VERTICAL TRANSISTORS AND HIGH PERFORMANCE DEVICES THEREOF

CROSS REFERENCE TO RELATED APPLICATIONS

This application is further cross referenced to U.S. patent application Ser. No. 10/463,038 by Q. Ouyang and Jack O. Chu, the inventors herein, filed herewith, entitled "Ultra Scalable High Speed Heterojunction Vertical N-channel MISFETs and Methods Thereof" which is directed to vertical N-channel MISFETs which is incorporated herein by reference and assigned to the assignee herein.

This application is further cross referenced to U.S. patent application Ser. No. 10/462,933 by Q. Ouyang and Jack O. Chu, the inventors herein, filed herewith, entitled "High Speed Lateral Heterojunction MISFETs Realized by 2-dimensional Bandgap Engineering and Methods Thereof" which is directed to lateral Heterojunction MISFETs which is incorporated herein by reference and assigned to the assignee herein.

FIELD OF THE INVENTION

This invention relates to semiconductor transistors and, more particularly, to a metal insulator semiconductor field effect transistor (MISFET) consisting of a conducting channel, which has no hetero-barrier in the current flow direction and a heterojunction between the source/drain and body (bulk) of the transistor.

BACKGROUND OF THE INVENTION

Silicon MOSFET scaling has become a major challenge in the semiconductor industry. Traditional techniques start to fail in reducing certain undesirable physical effects as device dimensions shrink down to the nanometer regime. For example, anti-punchthrough (APT) or halo implantation is used to reduce the short-channel effects (SCE). However, the abrupt doping profiles are difficult to achieve due to temperature enhanced diffusion, and these highly doped channels or pocket implant regions increase junction capacitance and band-to-band tunneling. It has been shown by S. Thompson, et al., in "MOS scaling: transistor challenges for the 21st century," Intel Technology Journal, Q3, 1998, that channel engineering can only decrease the circuit gate delay by ~10% for a given technology, and it cannot provide channel length scaling for generation after generation that gate oxide and source/drain (S/D) junction depth scaling has provided.

With bandgap engineering, an important degree of freedom can be provided in the device design. The growth of high-quality tensile strained Si/SiGe and compressively strained SiGe/Si heterostructures by molecular beam epitaxy (MBE), various types of chemical vapor deposition (CVD), and/or ion implantation allows incorporation of bandgap engineering concepts into a mature silicon technology.

Bandgap engineering has been utilized to realize various types of heterojunction field effect transistors (HFETs). The most widely studied is the modulation doped field effect transistors (MODFET), in which a quantum well is used to confine the carriers in a lightly doped semiconductor (See K. Ismail, "Si/SiGe High-Speed Field-Effect Transistors", IEDM, Technology Digest, p. 509–512, 1995). Higher carrier mobility can be achieved due to reduced impurity scattering, reduced surface roughness scattering in the buried channel, and strained-induced mobility enhancement, if any, depending on the hetero material system. Derived from the same concept, various types of heterostructure CMOS devices have also been proposed and studied (See M. A. Armstong, et al., "Design of Si/SiGe Heterojunction Complementary Metal-Oxide Semiconductor Transistors", IEDM Technology Digest, p. 761–764, 1995; S. Imai et al., "Si—SiGe Semiconductor Device and Method of Fabricating the Same", U.S. Pat. No. 5,847,419; and M. Kubo, et al., "Method of Forming HCMOS Devices with a Silicon-Germanium-Carbon compound Semiconductor Layer", U.S. Pat. No. 6,190,975, Feb. 20, 2001.) The advantage of these devices is the high carrier mobility and hence high drive current and high speed. However, two prominent problems still remain in these planar devices: device scaling and control of short-channel effects.

In planar FET devices, the channel length is limited by lithography. This problem can be solved if the devices are fabricated in a vertical fashion, in which the channel length is only determined by epitaxial techniques. And the diffusion of boron and phosphorus in the source/drain can be reduced by introducing thin SiGeC layers in the source/drain to achieve ultra scalable vertical transistors, as shown by Y. Ming, et al., in "25-nm p-Channel vertical MOSFET's with SiGeC source-drains", IEEE, Electron Device Letters, vol. 20, no. 6, 1999, and by H. Rücker et al., in "Dopant diffusion in C-doped Si and SiGe: physical model and experimental verification," IEDM, Technical Digest, p. 345–8, 1999.

As for short-channel effects, other than ultra-steep retrograded channel profiles and ultra-shallow source/drain junctions, silicon-on-insulator (SOI) has been used to control short-channel effects. However, SOI does not remove short-channel effects completely, and an inherent problem with SOI is the floating body effect. Another way to reduce the short-channel effect is to have a built-in energy barrier at the source/body junction, and the height of the barrier does not depend on the applied bias. The band offset provided by a heterojunction is very suitable in this case. A heterojunction MOSFET (HJMOSFET) has been proposed and studied by S. Hareland, et al., in "New structural approach for reducing punchthrough current in deep submicrometer MOSFETs and extending MOSFET scaling," IEEE Electronics Letters, vol. 29, no. 21, pp. 1894–1896, October 1993, and X. D. Chen, et al., in "Vertical P-MOSFETS with heterojunction between source/drain and channel," Device Research Conference, Denver, June 2000.

A p-channel/n-channel, complementary vertical MISFET device and a specific application of such devices in dynamic random access memory (DRAM) are described in U.S. Pat. Nos. 5,920,088, 6,207,977, 5,963,800, and 5,914,504. A heterojunction is utilized at the source/channel junction in the vertical devices. Even though very short channels may be achieved and short-channel effects may be reduced, there is still a big drawback with such device structures. At the off state (i.e., zero bias at the gate and high bias at the drain), the hetero-barrier is useful in reducing the drain-induced barrier lowering (DIBL), bulk punchthrough and therefore, off-state leakage current. However, at the on state (i.e., high bias at the gate and drain), the built-in hetero-barrier becomes harmful to the drive current. This is because the hetero-barrier at the source/channel junction severely blocks the thermal emission of the carriers from the source into the channel. The only way for carrier injection is the quantum mechanical tunneling across the barrier, which becomes the bottleneck of the transport in the channel. The so-called ballistic transport after crossing the barrier in the channel mentioned in these references will not occur due to strong surface roughness scattering. Therefore, the drive current in such devices is significantly reduced. Additionally, a part of the source (close to the channel) of such a device is undoped; therefore, the drive current will be further reduced by high series resistance in the source. A detailed study has been performed by Q. Ouyang, et al., in "Two-Dimensional Bandgap Engineering in Novel pMOSFETs," *SISPAD*, Seattle September 2000, and by X. D. Chen, et al., in "Vertical P-MOSFETS with heterojunction between source/drain and channel", *Device Research Conference*, Denver, June 2000.

Recently, a lateral high mobility, buried, p-channel heterojunction transistor (HMHJT) has been described by Q. Ouyang, et al., in U.S. Pat. No. 6,319,799B1. A detailed simulation study has been performed by Q. Ouyang, et al., in "A Novel Si/SiGe Heterojunction pMOSFET with Reduced Short-Channel Effects and Enhanced Drive Current," *IEEE Transactions on Electron Devices*, 47 (10), 2000. In addition, the device has been realized using a vertical structure fabricated by Q. Ouyang, et al., in "Fabrication of a Novel Vertical pMOSFET with Enhanced Drive Current and Reduced Short-Channel Effects and Floating Body Effects", *VLSI Symposium*, Kyoto, June 2001. In this case, compressively strained SiGe on Si is used to realize a high performance pMOSFET. However, the channel length scaling of such a device is still limited by boron diffusion from the source/drain into the channel. Furthermore, the transconductance for a buried channel may be reduced compared to a surface channel due to the reduced gate capacitance, despite the higher mobility in the buried channel. The present invention addresses these problems and provides a new structure for pMOSFETs. Ultimately, the present invention discloses a vertical high performance complementary MISFET.

U.S. Pat. No. 5,285,088 describes a "High Electron Mobility Transistor". This device has a pair of semiconductor layers for source/drain electrodes consisting of a poly SiGe layer and a poly Si layer so as to form a partially projected "overhanging-shape" over the active area. In this case, the source/drain and the gate are self-aligned. However, it is a planar structure and still suffers from the short-channel effects.

SUMMARY OF THE INVENTION

The objective of this invention is to provide a device structure that has superb performance and scalability. By using 2-dimensional bandgap engineering, the tradeoffs in the conventional Si technology can be avoided, and the drive current and leakage current are optimized independently. Consequently, very high drive current and excellent turn-off characteristics can be achieved simultaneously. The suppression of short-channel effects in such a device also allows continuous and more aggressive scaling of the MOSFET technology.

This invention describes a vertical p-channel and a vertical complementary MISFET structure having these advantages with various embodiments. Another aspect of this invention is the process integration for such devices. The devices described in this invention have at least a hetero-barrier between the source and the body of the transistor, however, no hetero-barrier in the channel along the current flow direction. Drain induced barrier lowering is substantially reduced due to the hetero-barrier at the source junction; hence, the subthreshold swing and off-state leakage are reduced. Meanwhile, the drive current is not limited by quantum mechanical tunneling since there is no hetero-barrier in the channel. Therefore, with these devices, very high on/off ratio can be achieved. Such devices are superb in high speed, low leakage and low power applications, such as DRAM, laptop computers, and wireless communications.

Any hetero-material systems with the proper band offset may be used to realize the device concept such as silicon-based or III–V material systems. Since silicon technology is the most mature, silicon based materials are the most economically feasible and attractive. For pMISFETs, compressively strained SiGe or SiGeC on silicon has the suitable band offset for holes. In order to realize the complementary MISFETs, there are two options or two types of Si-based heterostructures that can be used for nMISFETs because they have the suitable band offset for electrons. One is compressively strained Si or SiGe on relaxed SiGe buffer layers, and the other is tensile strained $Si_{1-x-y}Ge_xC_y$ on Si. With each heterostructure design, the channel could be a surface channel or a buried quantum well channel.

The carrier mobility depends not only on the strain in the crystal, but also on crystal orientation. A recent study showed that hole mobility is enhanced significantly on a (110) substrate along <110> direction, while the electron mobility remains highest on a (100) substrate along <100> direction for devices with a gate oxide less than 2 nm and a gate length less than 150 nm. While it is not practical to integrate a nMOSFET on a (100) plane and a pMOSFET on a (110) plane using conventional, planar silicon technology, it is relative easy to do so with vertical devices or FinFETs. Therefore, a high-hole-mobility channel and a high-electron-mobility channel can be realized simultaneously on the same wafer without introducing the strain in the channel by utilizing a heterostructure or any induced localized stress derived from the device fabrication process.

In the present invention, two embodiments for a vertical p-channel transistor are illustrated. Then two embodiments for a vertical CMOS are described. The fabrication methods are also described.

BRIEF DESCRIPTION OF THE DRAWINGS

These and other features, objects, and advantages of the present invention will become apparent upon consideration of the following detailed description of the invention when read in conjunction with the drawing in which.

DETAILED DESCRIPTION OF THE PREFERRED EMBODIMENTS

Figure 1:
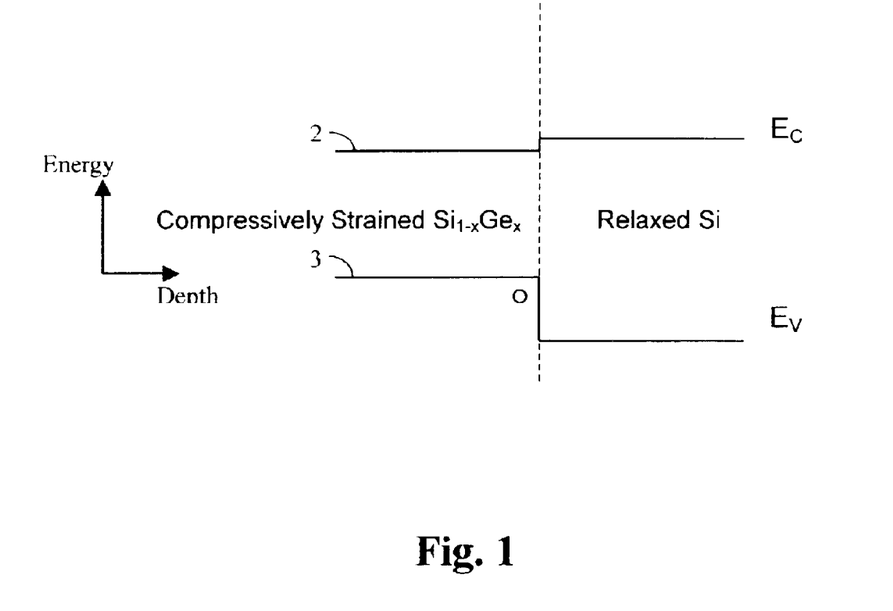
FIG. 1 is an energy band diagram of compressively strained SiGe or SiGe(C) on cubic Si.

The lattice spacing of carbon, silicon and germanium are 3.567 Å, 5.431 Å and 5.646 Å, respectively. Biaxial tensile strain exists in pseudomorphic SiC on relaxed Si, or in pseudomorphic Si on relaxed SiGe or Ge substrate, which means the larger lattice spacing in the growth plane (surface) and smaller lattice spacing in the growth direction (normal to the surface) in the pseudomorphic material. On the other hand, compressive strain exists in pseudomorphic SiGe on relaxed Si, or in pseudomorphic Ge on relaxed SiGe, which means the smaller lattice spacing in the growth plane (surface) and larger lattice spacing in the growth direction (normal to the surface) in the pseudomorphic material. Adding a small amount of carbon (<1%) into compressively strained SiGe on relaxed Si can compensate and reduce the strain in SiGe. Strain changes the band structure of the strained material. Therefore, strain may affect the energy band offset, effective mass and density of states. Referring to the drawing, FIG. 1 shows the conduction band and valence band of compressively strained SiGe or SiGe(C) on relaxed silicon by curves 2 and 3, respectively. Holes are confined in the compressively strained SiGe(C) which has high hole mobility, and this material system is suitable for pMOSFETs.

Figure 2:
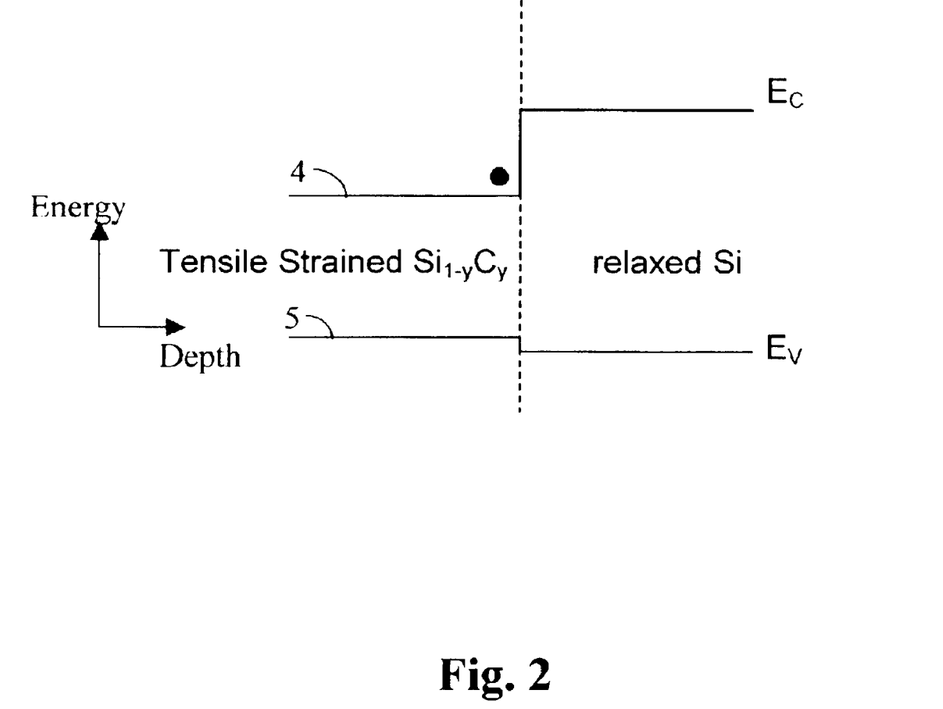
FIG. 2 is an energy band diagram of tensile strained SiC on cubic Si.
Figure 3:
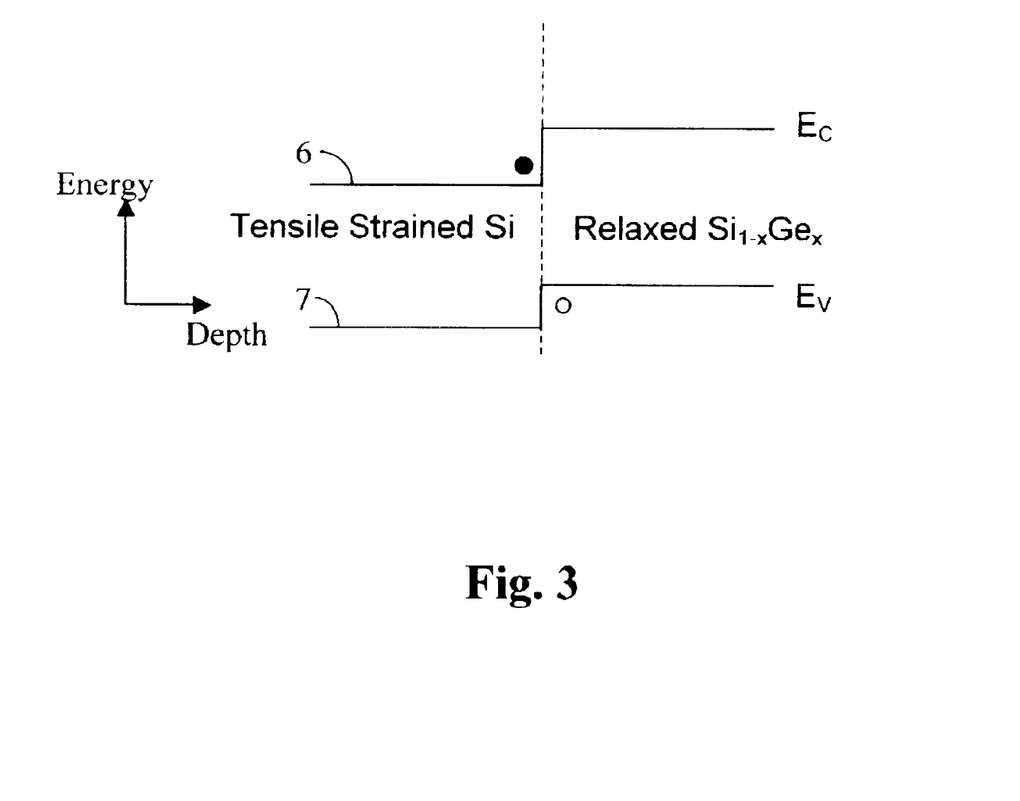
FIG. 3 is an energy band diagram of tensile strained Si on relaxed SiGe buffer.

FIG. 2 shows the conduction band and valence band of tensile strained $Si_{1-y}C_y$ on relaxed Si buffer layer by curves 4 and 5, respectively. In this case, electrons are confined in the tensile strained $Si_{1-y}C_y$ which has high electron mobility, and this material system is suitable for nMOSFETs. Furthermore, FIG. 3 shows the conduction band and valence band of tensile strained silicon on silicon germanium by curves 6 and 7, respectively. Electrons are confined in the tensile strained silicon which potentially has high electron mobility, and this material system may be suitable for nMOSFETs. With the three material systems, the channel could be a surface channel or a buried quantum well channel. In FIGS. 1–3, the ordinate represents energy and the abscissa represents depth.

Figure 4:
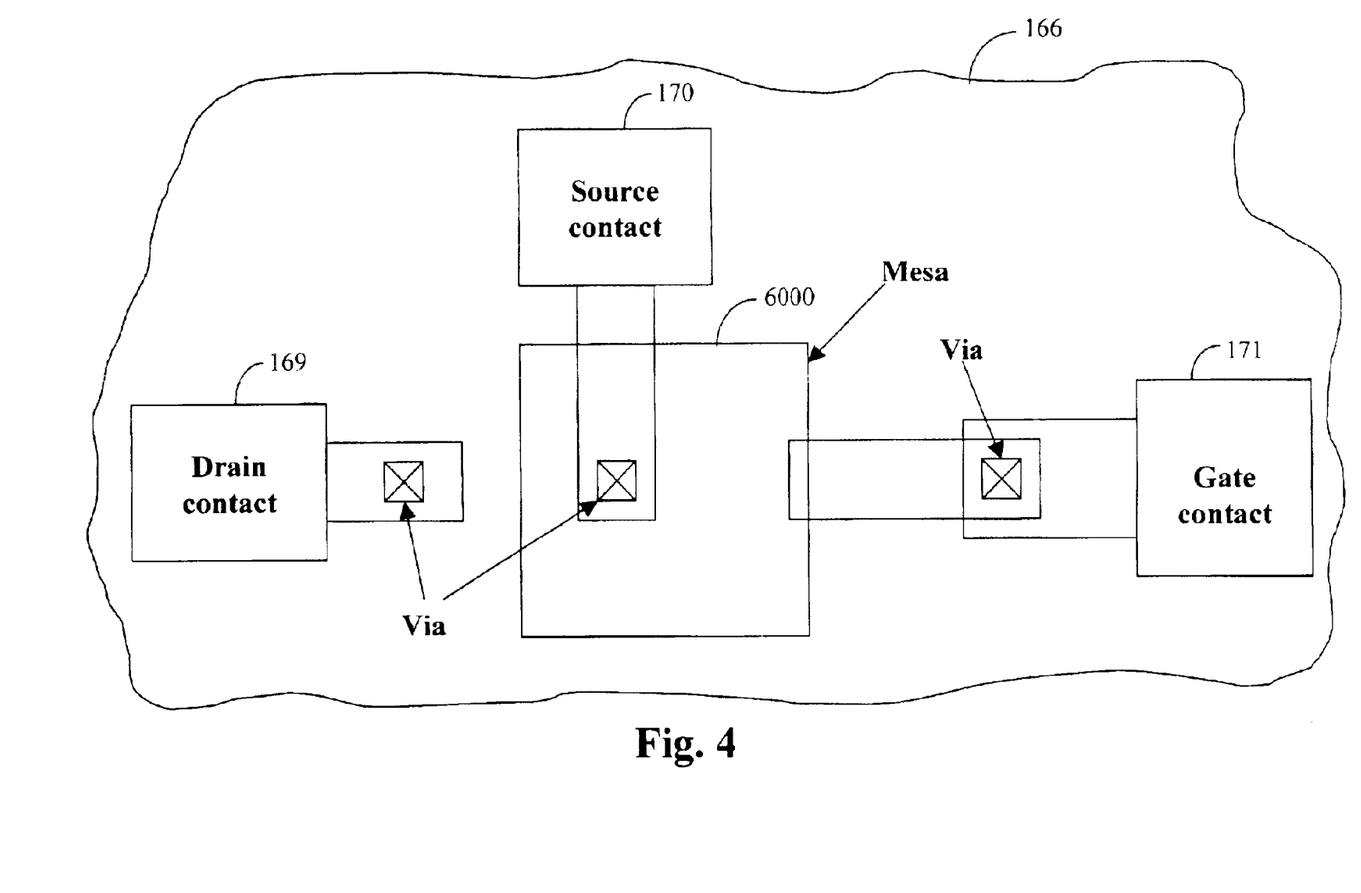
FIG. 4 is a top view of a vertical channel MOSFET.
Figure 5:
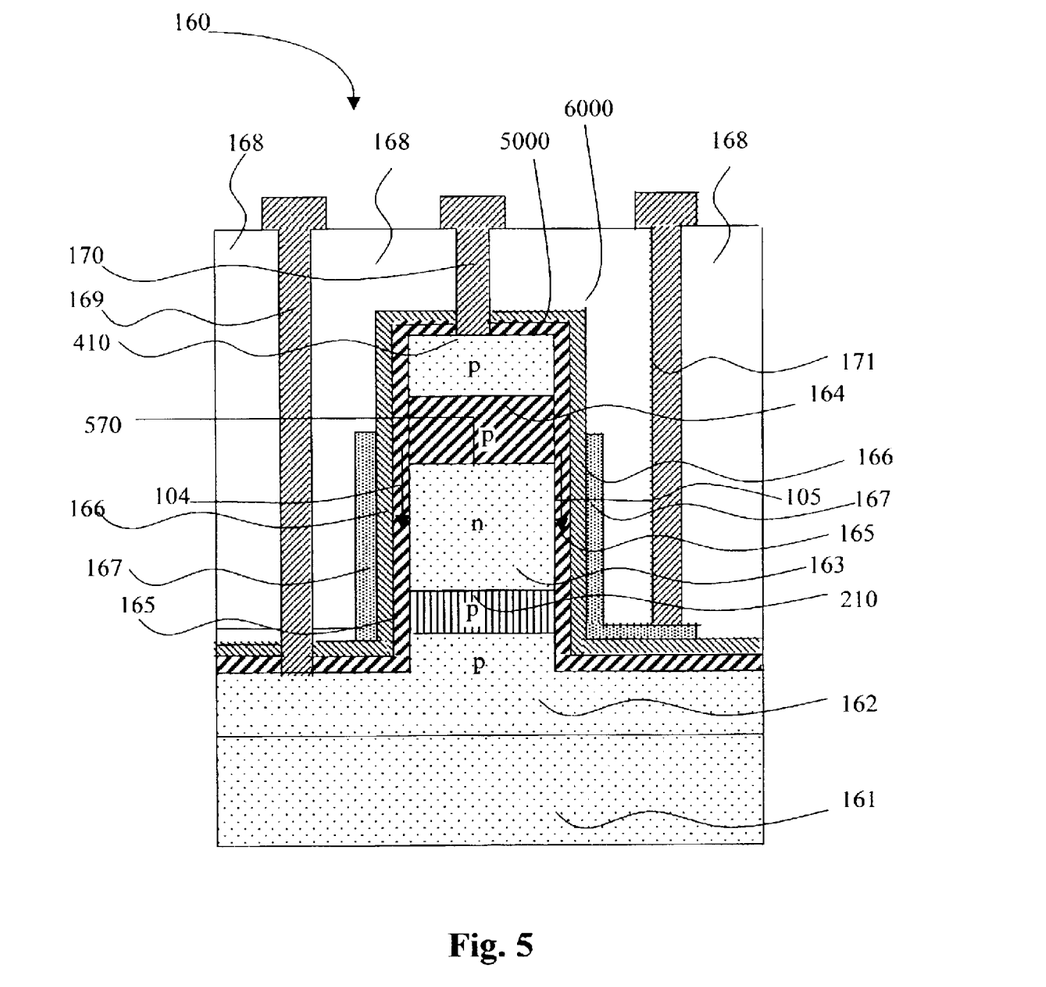
FIG. 5 is a cross sectional schematic of a vertical compressively strained SiGe/Si or SiGeC/Si surface channel pMOSFET with a diffusion barrier layer containing carbon and a composite source region consisting of a relaxed silicon layer and a strained SiGeC layer.

FIG. 4 shows the top view of a vertical device 160 (not to scale). FIG. 5 shows the cross sectional view of the first embodiment which is a compressively strained SiGeC vertical pMOSFET 160 comprising a vertical column 5000 comprising several layers or regions, such as a source layer or region 164, a body layer or region 163, and a drain layer or region 162, with a channel layer or region 165, an insulator layer or region 166, and a gate electrode layer or region 167 on the sidewalls. Vertical column or mesa 6000 forms vertical device 160. When SiGe layer or region 164 is highly strained, its critical thickness is rather small. The more strain in the layer, the thinner is the critical thickness at which the stained layer starts to relax. The critical thickness is understood in the art as a thickness where defects are generated within a layer or region to relieve its strain so that the layer or region relaxes towards its natural lattice spacing. The lattice spacing is determined by the composition of the layer. For example, Ge lattice is 1.04 times the lattice spacing of silicon. A 50% Ge composition in a SiGe layer would be expected to have a lattice spacing of 1.02 times the lattice spacing of silicon. In this embodiment, a relaxed silicon layer or region, poly silicon layer or region or poly SiGe layer or region 410 is formed on top of strained SiGe layer 164, and together they form the composite source that has sufficient thickness for silicidation. Layer 410 can be as thick as desired while layer or region 164 has a thickness below or about the critical thickness.

The device has the following structural characteristics:
1) The drain is $p^+$-type single crystal silicon 162 with a concentration level greater than $1\times10^{19}$ atom/cm$^3$.
2) The body is n-type silicon 163, and the doping level is adjusted to achieve the desirable threshold voltage;
3) The p-type SiGeC layer 210 over layer 162 is used to reduce boron diffusion from drain 162 into the body 163; layer 210 has a p-type concentration level greater than $1\times10^{19}$ atoms/cm$^3$.
4) The source is $p^+$-type compressively strained Ge, GeC or SiGeC 164 and relaxed silicon or poly silicon or poly SiGe 410 both having a p-type concentration level greater than $1\times10^{19}$ atom/cm$^3$;
5) The channel 165 is compressively strained SiGeC or silicon, and there is no hetero-barrier along the current flow direction shown by arrow 104;
6) A strained SiGeC/Si heterojunction is formed between the source 164 and the body 163 at the interface 570, and preferably, aligned with the source/body metallurgical p/n junction;
7) The gate is a conducting layer 167 overlapping the entire channel 165 over body 163 from the source 164 and to the drain 162 with an insulator 166 in between.
8) The drain, source, and gate electrodes 169, 170 and 171 are coupled to the drain 162, the composite source 164 plus 410 and the gate 167, respectively.
9) Layer 161 may be bulk silicon or SOI substrate or SiGe-on-insulator.

Gate dielectric layer or region 166 may be an oxide, nitride, oxynitride of silicon, and oxides and silicates of Hf, Al, Zr, La, Y, Ta alone or in combination.

Conducting region 167 may be a metal, metal silicide, doped poly silicon, or doped poly SiGe.

Layer 210 is doped p-type in the range from $1\times10^{19}$ to $1\times10^{21}$ atoms/cm$^3$.

Layer or region 410 is doped p-type in the range from $1\times10^{19}$ to $1\times10^{21}$ atoms/cm$^3$.

Vertical structure or column 5000 may have a sidewall in the crystalline plane (100) and be perpendicular to the substrate plane or major surface of the substrate.

Figure 6:
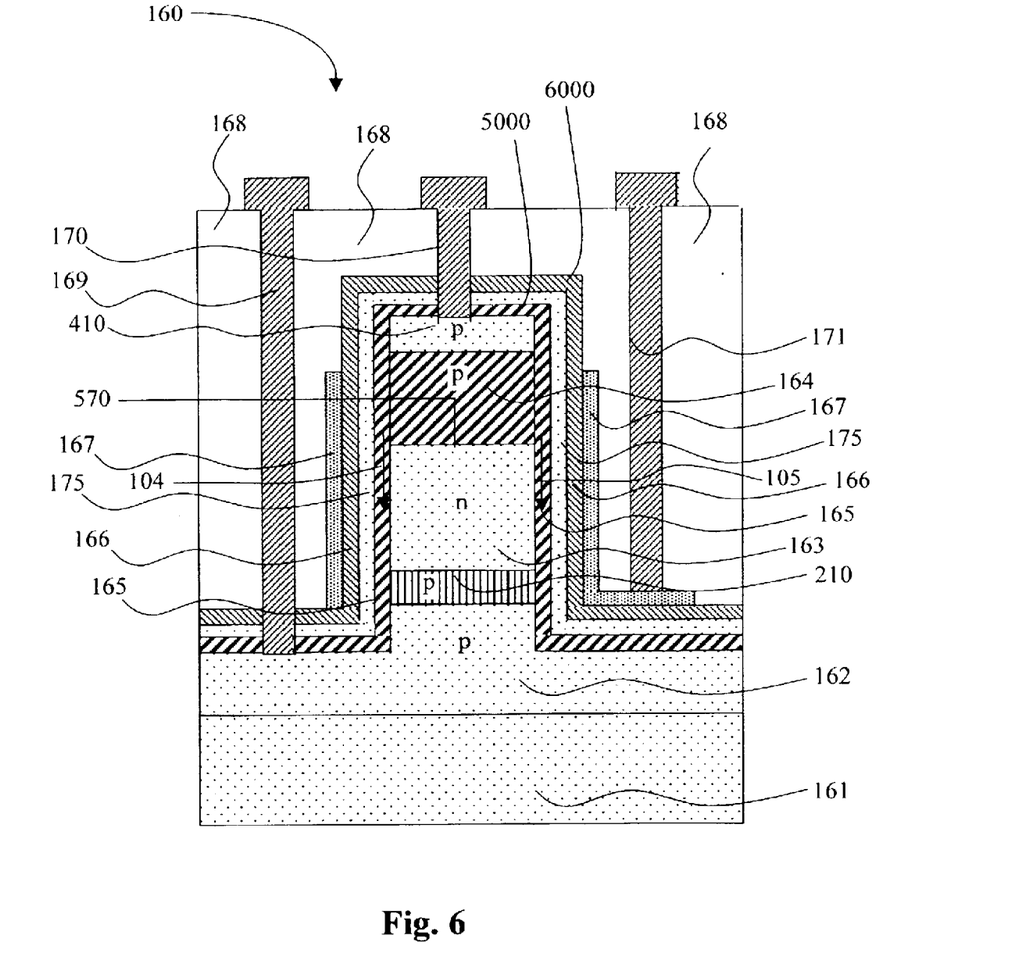
FIG. 6 is a cross sectional schematic of a vertical compressively strained SiGe/Si or SiGeC/Si buried channel pMOSFET with a diffusion barrier layer containing carbon and a composite source region consisting of a relaxed silicon layer and a strained SiGeC layer.

For low noise applications, a buried channel may be preferred. A vertical buried channel pMOSFET is shown in FIG. 6. A silicon cap layer or region 175 is formed before the gate oxidation. In this case, the strained SiGe quantum well channel 165 will be able to maintain its high hole mobility because there is no surface roughness scattering. Except for silicon cap layer or region 175, FIG. 6 is the same as FIG. 5.

Note that the above embodiment is an asymmetric device, which has a heterojunction only between the source and the body i.e. interface 570. For certain circuit applications, such as transmission gate circuits, the devices are preferred to be symmetric.

Figure 7:
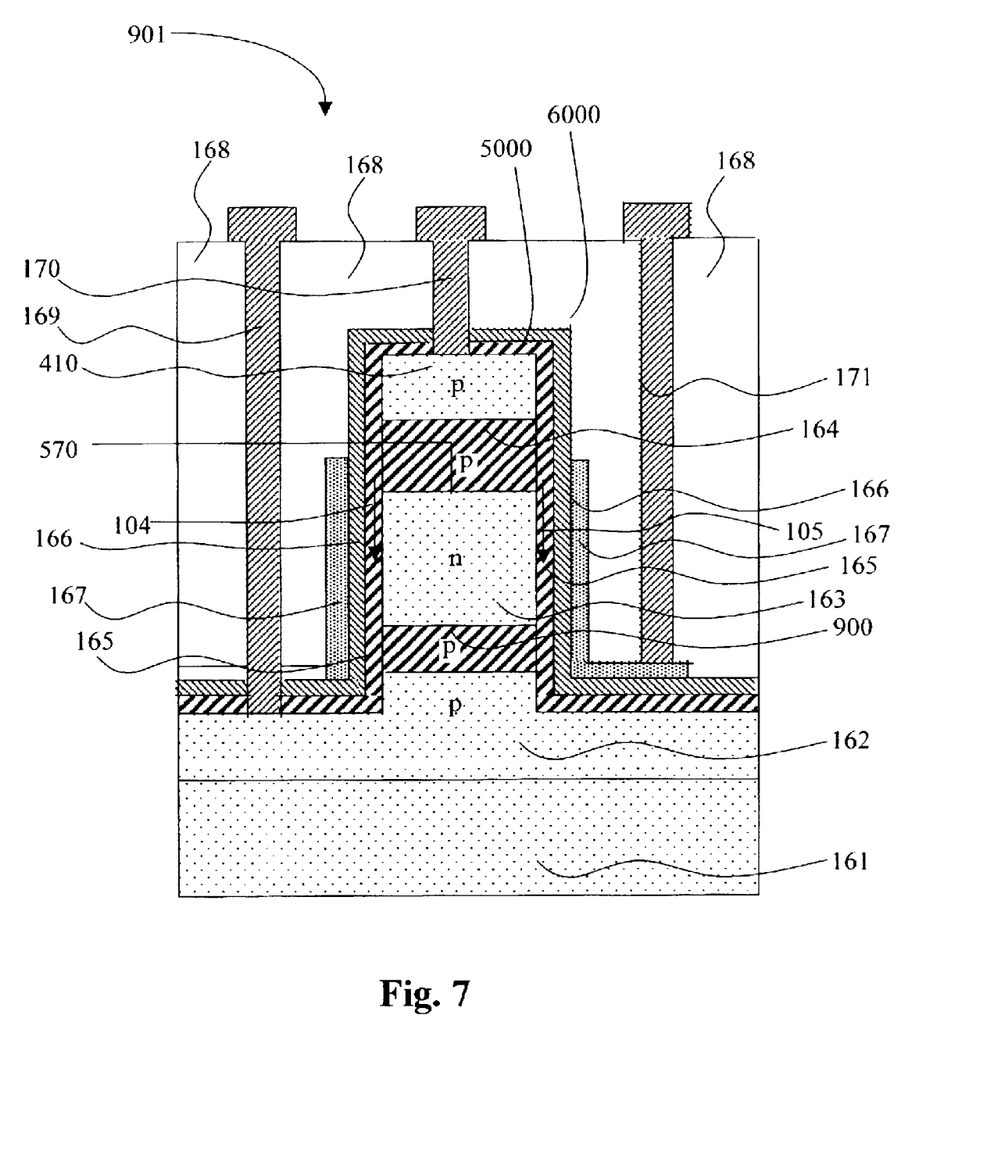
FIG. 7 is a cross sectional schematic of a vertical compressively strained SiGe/Si or SiGeC/Si surface channel pMOSFET with a heterojunction at both source and drain junction.

The fourth embodiment of the present invention, shown in FIG. 7, is a surface channel pMOSFET 901. It has a similar structure to the first embodiment, but with a surface channel and a composite drain which comprises a thin compressively strained SiGeC layer 900 and silicon layer or region 162. In this structure, the SiGeC layers or regions 164 and 900 may or can have the same amount of strain. Region 900 may be p-type having a concentration level greater than $1\times10^{19}$ atoms/cm$^3$ carbon doped region 900 may be doped p-type in the range from $1\times10^{19}$ to $1\times10^{21}$ atoms/cm$^3$. Therefore, the hetero-barriers at the source and the drain junctions have the same height; hence the device is close to a symmetric device.

Figure 8A:
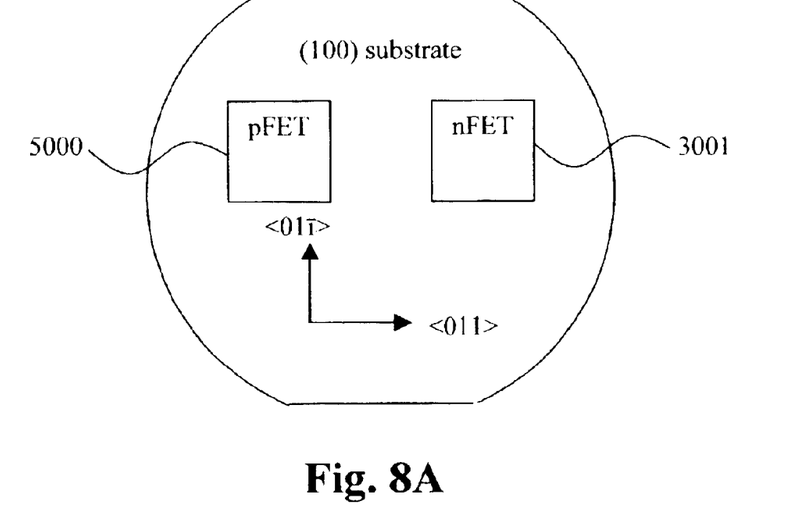
FIG. 8A and FIG. 8B are top views of the orientations of the mesa structures or vertical structures for a vertical CMOS inverter on a (100) substrate.
Figure 8B:
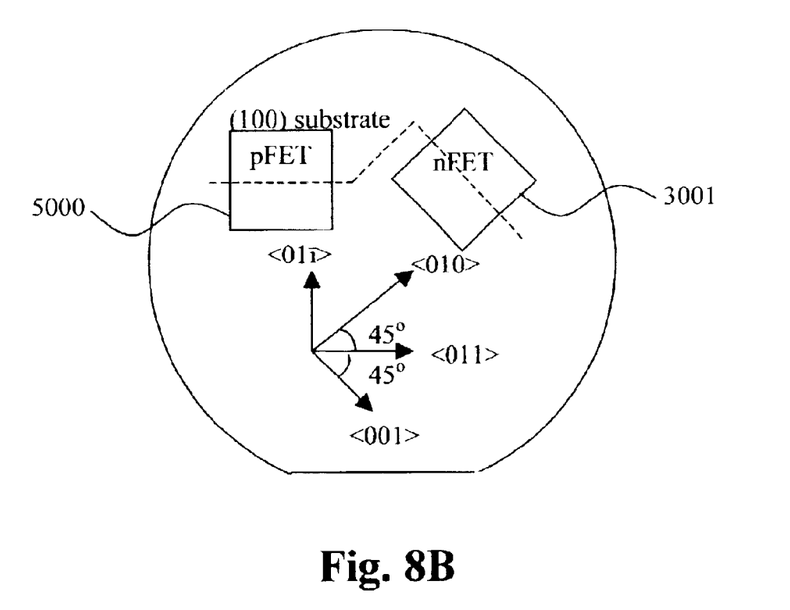

FIGS. 8A and 8B show the top view schematic of orientations of the mesa structures or vertical structures for a vertical NMOSFET and a vertical pMOSFET on a (100) silicon substrate. Both n- and p-channels in FIG. 8A are in the planes of the (110) family. Even though hole mobility in the (110) plane is higher than that of the (100) plane, the electron mobility is degraded compared to the (100) plane. However, when the mesa structure or vertical structure of the nMOSFET is rotated 45 degrees from the wafer notch line then the n-channels on the four sidewalls of the mesa structure or vertical structure are in the (001), (010), (001) and (010) planes, as shown in FIG. 8B. Meanwhile, in FIG. 8B, the mesa structure or vertical structure of the pMOSFET has a sidewall aligned with the wafer notch line, and the p-channels on the sidewalls of the mesa structure or vertical structure are in the (011), (011), (011) and (011) planes. Consequently, the layout for a vertical CMOS shown in FIG. 8B can achieve the high hole-mobility and high electron-mobility simultaneously. It should be noted that the orientation scheme shown in FIG. 8B can be used for any vertical MOSFETs, such as Si vertical MOSFETs with or without a replacement gate and the heterojunction MOSFETs described in this specification.

Figure 9:
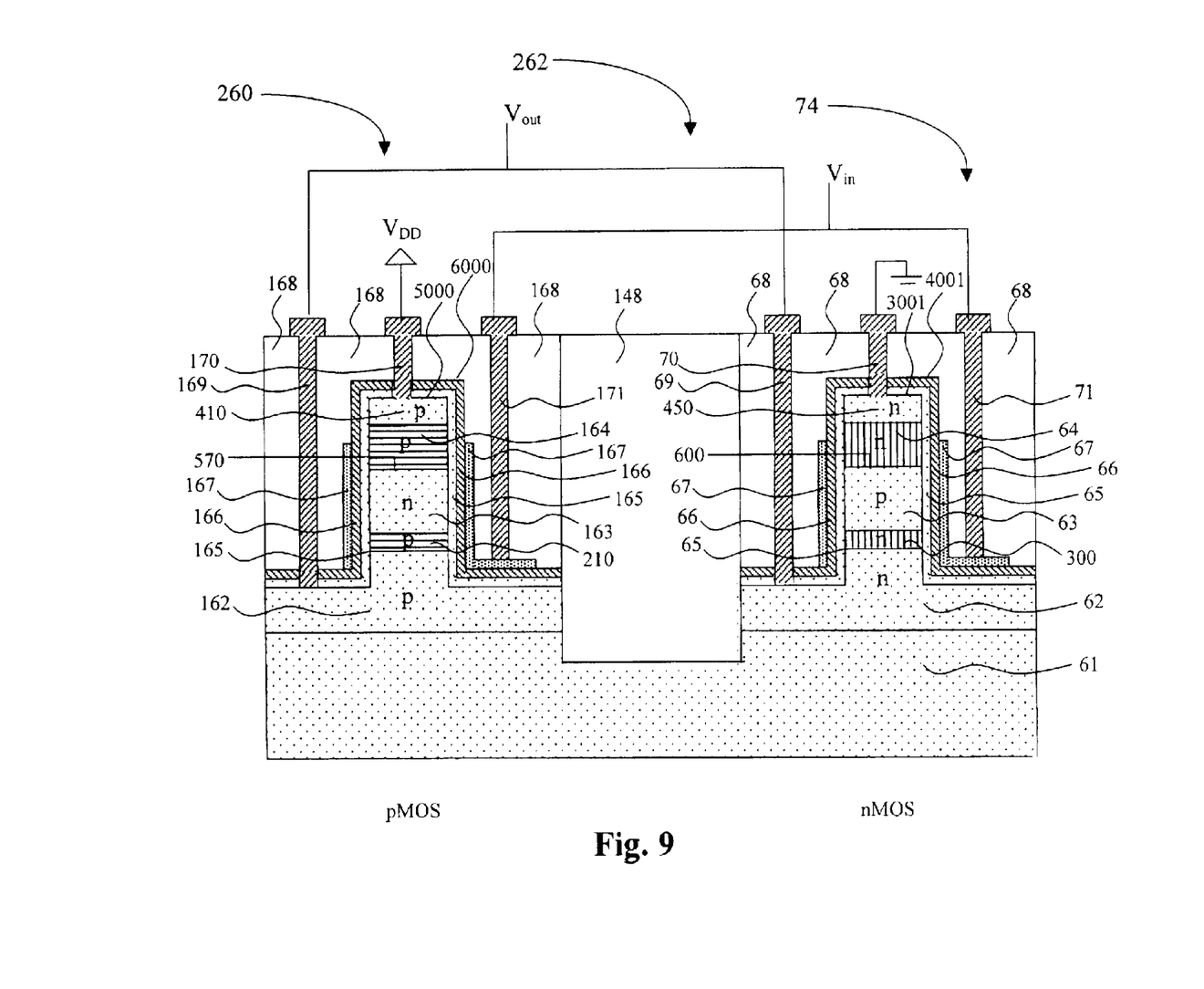
FIG. 9 is a cross sectional schematic of a vertical CMOS with tensile strained SiC source/drain for the nMOSFET and compressively strained SiGeC source/drain for pMOSFET according to the present invention.

FIG. 9 shows an embodiment of a vertical CMOS inverter 262, comprising a vertical nMOSFET 74, and a vertical pMOSFET 260. The mesa orientation is shown in FIG. 8B, where the p-channel mesa 5000 sidewall is in the plane (110) and the n-channel mesa 3001 sidewall is in the plane (100). The device isolation is provided by insulator regions or blanket dielectric layers 168, 148 and 68. The nMOSFET 74 has a tensile strained SiGeC source 64, and a carbon-doped layer 300 in the drain to reduce phosphorus diffusion if the drain 62 is doped with phosphorus; the pMOSFET has a compressively strained SiGeC source 164, a carbon-doped layer 210 in the drain to reduce boron diffusion if the drain 162 is doped with boron. Both devices have a silicon surface channel 65, 165. The gate insulator layer or region 66, 166 can be oxide, oxynitride, other high-permittivity dielectrics, or a combination thereof. The gate electrode 67, 167 can be the same kind of metal with a mid-gap work function, or two different types of metal with suitable work function, or n-type poly silicon or poly SiGe for nMOSFET and p-type poly silicon or poly SiGe for pMOSFET. Vertical column 6000 forms pMOSFET 260. Vertical column 4001 forms nMOSFET 74.

A method of preparing an inverter made of the vertical field effect CMOS transistors shown in FIG. 9 is described comprising the steps of:

forming a silicon epitaxial layer or region 62 on a first single crystalline substrate 61, doping the silicon epitaxial layer or region 62 n-type to a concentration level greater than $1\times10^{19}$ atoms/cm$^3$, forming a $Si_{1-i-j}Ge_iC_j$ epitaxial layer or region 300 over the n-type silicon layer or region 62, forming a silicon epitaxial layer or region 63 over the $Si_{1-i-j}Ge_iC_j$ layer or region 300, doping the silicon epitaxial layer or region 63 p-type, forming a strained $Si_{1-y}C_y$ epitaxial layer or region 64 over the p-type silicon layer or region 63, doping the strained $Si_{1-y}C_y$ layer or region 64 n-type to a concentration level greater than $1\times10^{19}$ atoms/cm$^3$, forming a silicon layer or region 450 over the n-type strained $Si_{1-y}C_y$ layer or region 64, doping the silicon layer or region 450 n-type to a concentration level greater than $1\times10^{19}$ atoms/cm$^3$, forming a vertical column structure 3001 comprising at least one sidewall extending from the silicon layer or region 62, over the second layer of strained $Si_{1-x}C_x$ layer or region 300, over third layer or region of p-type silicon 63, over the fourth layer or region of strained $Si_{1-y}C_y$ 64, to the silicon layer or region 450, forming a silicon layer or region 65 over a region of the at least one sidewall of the vertical structure 3001, forming a dielectric layer or region 66 over the silicon layer or region 65, forming a conducting layer or region 67 over the dielectric layer or region 66, masking and etching a nearby region to expose the single crystalline substrate 61, forming a p-type silicon 162 layer or region with a concentration level greater than $1\times10^{19}$ atoms/cm$^3$ on a first single crystalline substrate 161, forming a carbon-doped epitaxial layer or region 210 over the layer or region 162, doping the layer or region 210 p-type to a concentration level greater than $1\times10^{19}$ atoms/cm$^3$, forming a silicon epitaxial layer or region 163 over the layer or region 210, doping the layer or region 163 n-type, forming a compressively strained $Si_{1-w-q}Ge_wC_q$ epitaxial layer or region 164 over the layer or region 163, doping the $Si_{1-w-q}Ge_wC_q$ layer or region 164 p-type to a concentration level greater than $1\times10^{19}$ atom/cm$^3$, forming a silicon epitaxial layer or region 410 over the $Si_{1-w-q}Ge_wC_q$ layer or region 164, doping the silicon layer or region 410 p-type to a concentration level greater than $1E19$ cm$^{-3}$, forming a vertical column structure 5000 comprising the first layer or region of silicon 162, second layer of carbon-doped layer or region 210, third layer of silicon layer or region 163, fourth layer or region of $Si_{1-w-q}Ge_wC_q$ 164, and fifth layer or region of silicon 410, forming a strained $Si_{1-s}Ge_s$ layer or region 165 over the outer perimeter of the above vertical column structure 5000, forming a dielectric layer or region 166 over the outer perimeter of above layer or region 165, and forming a conducting layer or region 167 over the outer perimeter of above dielectric layer or region 166.

The above method may further comprise the steps of:

forming a blanket dielectric 68 layer over and above the entire vertical column structure 4001, forming a conducting layer or region 69 through the above blanket dielectric layer 68 in contact to said n-type silicon layer 62, forming a conducting layer or region 70 through the above blanket dielectric layer 68 in contact to said silicon layer or region 450 at the top of the above vertical column structure 4001, forming a conducting layer or region 71 through the above blanket dielectric layer 68 in contact to the conducting layer or region 67 on the outer perimeter of the vertical column structure 4001, forming a blanket dielectric layer 168 over and above the entire vertical column structure 6000, forming a conducting layer or region 169 through the above blanket dielectric layer 168 in contact to the p-type silicon layer or region 162, forming a conducting layer or region 170 through the above blanket dielectric layer 168 in contact to the p-type silicon layer or region 410 at the top of the above vertical column structure 5000, forming a conducting layer or region 171 through the above blanket dielectric layer 168 in contact to the conducting layer or region 167 on the outer perimeter of the vertical column structure 5000, and forming a dielectric region 148 on layer 61 in between the two vertical column structures 4001 and 6000 to serve as the device isolation.

The sidewall of the vertical column 3001 is preferred to be in the plane (100), and be perpendicular to the substrate plane.

The sidewall of the vertical column 5000 is preferred to be in the plane (110), and be perpendicular to the substrate plane.

Figure 10:
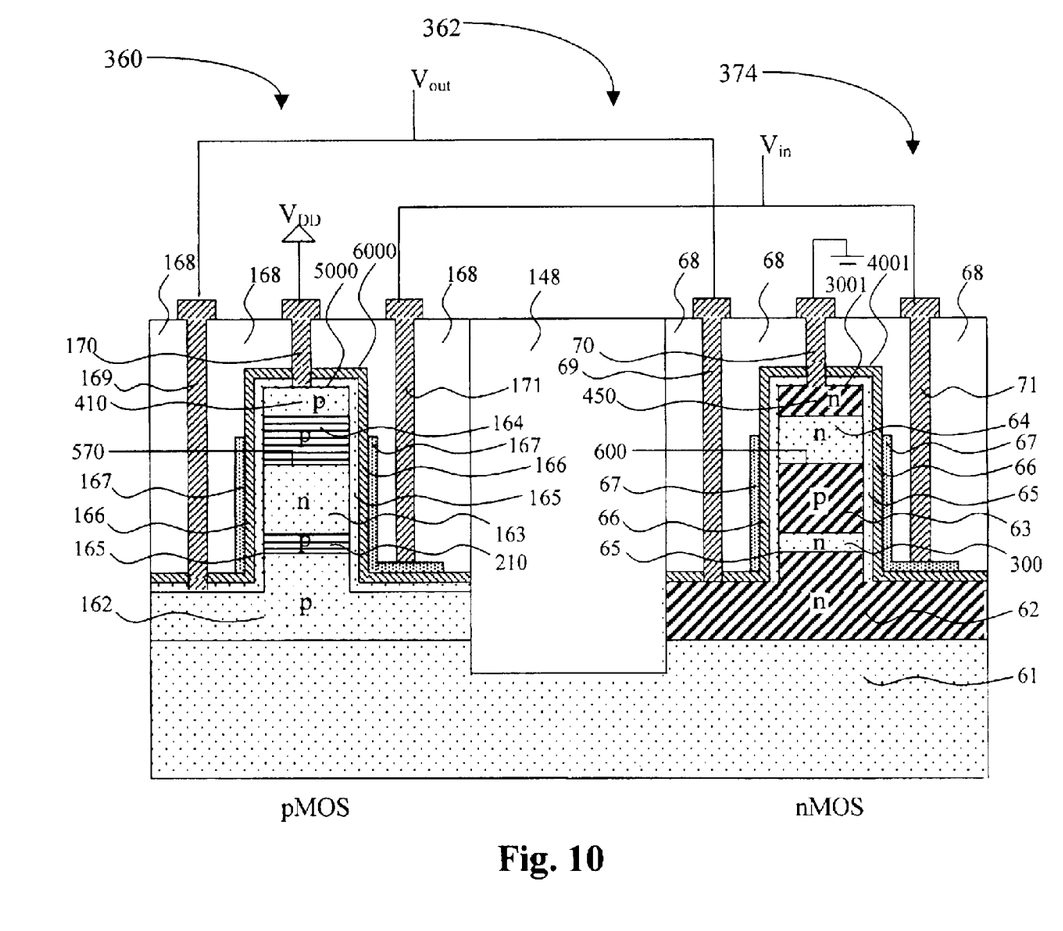
FIG. 10 is a cross sectional schematic of a vertical CMOS with tensile strained Si source/drain for the nMOSFET and compressively strained SiGeC source/drain for pMOSFET according to the present invention.

FIG. 10 shows the second embodiment of the vertical CMOS 362, similar to FIG. 9 except for the nMOSFET 374. The nMOSFET 374 has a tensile-strained silicon channel 65 built on a relaxed SiGe body 63. Body 63 is relaxed with respect to virtual substrate 62. The advantage of having tensile-strained silicon as the channel is the higher electron mobility. The mesa 3001 orientation is shown in FIG. 8B, where the p-channel is in the plane (110) and the n-channel is in the plane (100) for higher hole and electron mobilities.

A method of preparing an inverter made of the vertical field effect CMOS transistors is described comprising the steps of:

forming a relaxed $Si_{l-i}Ge_i$ epitaxial layer or region 62 on a first single crystalline substrate 61, doping the $Si_{l-i}Ge_i$ epitaxial layer or region 62 n-type to a concentration level greater than $1\times10^{19}$ atoms/cm$^3$, forming a carbon-doped SiGe epitaxial layer or region 300 over the n-type $Si_{l-i}Ge_i$ layer or region 62, doping the silicon epitaxial layer or region 300 n-type to a concentration level greater than $1\times10^{19}$ atoms/cm$^3$, forming a relaxed $Si_{l-i}Ge_i$ epitaxial layer or region 63 over the carbon-doped SiGe layer 300, doping the silicon epitaxial layer 63 p-type, forming a tensile strained silicon epitaxial layer or region 64 over the p-type $Si_{l-i}Ge_i$ layer 63, doping the strained silicon layer 64 n-type to a concentration level greater than $1\times10^{19}$ atoms/cm$^3$, forming a relaxed $Si_{l-i}Ge_i$ layer or region 450 over the n-type strained silicon layer 64, doping the $Si_{l-i}Ge_i$ layer 450 n-type to a concentration level greater than $1\times10^{19}$ atoms/cm$^3$, forming a vertical column structure 3001 comprising at least one sidewall extending from the relaxed $Si_{l-i}Ge_i$ layer 62, over the second layer of carbon-doped SiGe layer 300, over third layer of p-type relaxed $Si_{l-i}Ge_i$ 63, over fourth layer of strained silicon 64, to the SiGe layer 450, forming a strained silicon layer or region 65 over a region of the at least one sidewall of the vertical structure 3001, forming a dielectric layer or region 66 over the silicon layer or region 65, forming a conducting layer or region 67 over the dielectric layer or region 66, masking and etching a nearby region to expose the single crystalline substrate 161, forming a p-type silicon layer or region 162 with a concentration level greater than $1\times10^{19}$ atoms/cm$^3$ on a first single crystalline substrate 161, forming a carbon-doped epitaxial layer or region 210 over the layer or region 162, doping the layer 210 p-type to a concentration level greater than $1\times10^{19}$ atoms/cm$^3$, forming a silicon epitaxial layer or region 163 over the layer 210, doping the layer 163 n-type, forming a compressively strained $Si_{l-w-q}Ge_wC_q$ epitaxial layer or region 164 over the layer 163, doping the $Si_{l-w-q}Ge_wC_q$ layer 164 p-type to a concentration level greater than $1\times10^{19}$ atom/cm$^3$, forming a silicon epitaxial layer or region 410 over the $Si_{l-w-q}Ge_wC_q$ layer 164, doping the silicon layer 410 p-type to a concentration level greater than $1\times10^{19}$ cm$^{-3}$, forming a vertical column structure 5000 comprising the first layer of silicon 162, second layer of carbon-doped layer 210, third layer of silicon layer 163, fourth layer of $Si_{l-w-q}Ge_wC_q$ 164, and fifth layer of silicon 410, forming a strained $Si_{l-s}Ge_s$ layer or region 165 over the other perimeter of the above vertical column structure 5000, forming a dielectric layer or region 166 over the outer perimeter of the above layer 165, and forming a conducting layer or region 167 over the outer perimeter of above dielectric layer 166.

The above method may further comprise the steps of:

forming a blanket dielectric 68 layer over and above the entire vertical column structure 4001, forming a conducting layer or region 69 through the above blanket dielectric layer 68 in contact to said n-type silicon layer or region 62, forming a conducting layer or region 70 through the above blanket dielectric layer 68 in contact to said silicon layer 450 at the top of the above vertical column structure 4001, forming a conducting layer or region 71 through the above blanket dielectric layer 68 in contact to the conducting layer or region 67 on the outer perimeter of the vertical column structure 4001, forming a blanket dielectric layer 168 over and above the entire vertical column structure 6000, forming a conducting layer or region 169 through the above blanket dielectric layer 168 in contact to the p-type silicon layer or region 162, forming a conducting layer or region 170 through the above blanket dielectric layer 168 in contact to the p-type silicon 410 at the top of the above vertical column structure 2001, forming a conducting layer or region 171 through the above blanket dielectric layer 168 in contact to the conducting layer 167 on the outer perimeter of the vertical column structure 5000, and forming a dielectric region 148 on layer 61 in between the two vertical column structures 4001 and 6000 to serve as the device isolation.

The sidewall of the vertical column 3001 is preferred to be in the plane (100), and be perpendicular to the substrate plane.

The sidewall of the vertical column 5000 is preferred to be in the plane (110), and be perpendicular to the substrate plane.

According to the preferred embodiment, this invention further comprises the scheme for process integration for a vertical high mobility heterojunction pMISFET:

Epitaxial growth of a stack of several layers for the drain, body, and the source with or without in-situ doping;

patterning/etching to form a mesa 5000, or pedestal, or pillow, or column, or fin;

epitaxial growth of the channel layer 165, the cap layer if desired, on the sidewall of the mesa, pedestal, pillow, column or fin;

growth or deposition of the insulator layer, which may be an oxide, oxynitride, other high-permittivity dielectrics, or a combination thereof;

growth or deposition of the gate electrode layer, which may be poly silicon, poly SiGe or metal, on the sidewall of the mesa, or pedestal, or pillow, or column, or fin;

patterning/etching gate electrode, forming the final vertical structure 6000;

ion implant and annealing if the source, drain, body, or the poly Si or poly SiGe gate electrode is not in-situ doped;

gate patterning and etching;

field oxide deposition;

contact opening;

source/drain silicidation; and metallization and metal sintering.

It should be noted that in the drawing like elements or components are referred to by like and corresponding reference numerals.

While there has been described and illustrated a semiconductor device containing a high mobility channel and a heterojunction which preferably coincides with the junction of source and/or drain, it will be apparent to those skilled in the art that modifications and variations are possible without deviating from the broad scope of the invention which shall be limited solely by the scope of the claims appended hereto.

What is claimed is:

1. A field effect transistor comprising:
   a substrate,
   a first single crystalline silicon region having a p-type concentration level greater than $1 \times 10^{19}$ atoms/cm$^3$ on said substrate,
   a second carbon-doped epitaxial region over said first crystalline silicon region having a p-type concentration level greater than $1 \times 10^{19}$ atoms/cm$^3$,
   a third silicon epitaxial region over said second carbon-doped region doped n-type,
   a fourth compressively strained $Si_{l-w-q}$ epitaxial region over said third silicon epitaxial region, said $Si_{l-w-q}$ region having a p-type concentration level greater than $1 \times 10^{19}$ atoms/cm$^3$,
   a fifth silicon containing region over said fourth $Si_{l-w-q}Ge_wC_q$ region having a p-type concentration level greater than $1 \times 10^{19}$ atoms/cm$^3$,
   a vertical structure comprising at least one sidewall extending from said first silicon region, second region of carbon-doped layer, third region of silicon, fourth region of $Si_{l-w-q}Ge_wC_q$ epitaxial region to said fifth region of silicon,
   a sixth compressively strained $Si_{l-s}Ge_s$ region over a region of said at least one sidewall of said vertical structure extending from said second region of carbon-doped layer, over said third region of silicon to said fourth region of $Si_{l-s}Ge_wC_q$ epitaxial region,
   a gate dielectric region over said sixth compressively strained $Si_{l-w-q}Ge_s$ region, and a gate conducting region over said dielectric region.

2. The field effect transistor according to claim 1 further including:
   a blanket dielectric layer over and above said vertical structure,
   a first conducting via through said blanket dielectric layer in contact to said first p-type silicon region,
   a second conducting via through said blanket dielectric layer in contact to said fifth p-type silicon containing region at the top of said vertical structure, and
   a third conducting via through said blanket dielectric layer in contact to said gate conducting region.

3. The field effect transistor according to claim 1 wherein said fifth silicon containing region is relaxed with respect to the upper surface of said fourth $Si_{l-w-q}Ge_wC_q$ region.

4. The field effect transistor according to claim 1 wherein said fifth silicon containing region is selected from the group consisting of single crystal silicon, poly silicon and poly SiGe.

5. The field effect transistor according to claim 1 wherein said sidewall of said vertical structure is in the crystalline plane (110), and perpendicular to a major surface of said substrate.

6. The field effect transistor according to claim 1 wherein said sixth strained $Si_{l-s}G_s$ region on said sidewall of said vertical structure is compressively strained with respect to said first silicon region.

7. The field effect transistor according to claim 1 wherein said gate dielectric region is selected from the group consisting of an oxide, nitride, oxynitride of silicon, and oxides and silicates of Hf Al, Zr, La, Y, Ta, singly or in combination thereof.

8. The field effect transistor according to claim 1 wherein said gate conducting region is selected from the group consisting of metal, metal silicide, doped poly silicon and doped poly SiGe.

9. The field effect transistor according to claim 1 wherein said second carbon-doped region is doped p-type in the range from $1 \times 10^{19}$ to $1 \times 10^{21}$ atoms/cm$^3$.

10. The field effect transistor according to claim 1 wherein said fifth silicon containing region is doped p-type in the range from $\times 10^{19}$ to $1 \times 10^{21}$ atoms/cm$^3$.

11. The field effect transistor according to claim 1 wherein said sixth strained $Si_{l-s}Ge_s$ region is doped p-type in the region adjacent to said first p-type region, second region, fourth region and fifth region while doped n-type in the region adjacent to said third n-type silicon.

12. The field effect transistor according to claim 1 further including a seventh silicon region over said sixth compressively strained $Si_{l-s}Ge_s$ region and below said gate dielectric region.

13. The field effect transistor according to claim 12 wherein said sixth strained $Si_{l-s}Ge_s$, region and said seventh silicon region are doped p-type in the region adjacent to said first p-type region, second region, fourth region and fifth region while doped n-type in the region adjacent to said third n-type silicon.

14. The field effect transistor according to claim 1 further including an eighth compressively strained $Si_{l-x-y}Ge_xC_y$ epitaxial region over said first silicon region, said eighth compressively strained $Si_{l-x-y}Ge_xC_y$ epitaxial region having a p-type concentration level greater than $1 \times 10^{19}$ atom/cm$^3$.

15. The field effect transistor according to claim 14 wherein said third silicon region is relaxed with respect to the upper surface of said eighth $Si_{l-x-y}Ge_xC_y$, region.

16. The field effect transistor according to claim 14 wherein said sixth strained $Si_{l-s}G_s$ region is doped p-type in the region adjacent to said first p-type region, eighth epitaxial region, fourth region and fifth region while doped n-type in the region adjacent to said third n-type silicon.

17. An inverter comprising:

a first silicon epitaxial region on a first single crystalline substrate having a n-type concentration level greater than $1 \times 10^{19}$ atoms/cm$^3$, a second $Si_{l-i-j}Ge_iC_j$ epitaxial region over said first n-type silicon region, a third silicon epitaxial region over said second $Si_{l-i-j}Ge_iC_j$ epitaxial region doped p-type, a fourth strained $Si_{l-y}C_y$ epitaxial region over said third p-type silicon region having a n-type concentration level greater than $1 \times 10^{19}$ atoms/cm$^3$, a fifth region selected from a group consisting of single crystalline silicon, poly silicon and poly SiGe over said fourth n-type strained $Si_{l-y}C_y$ region having a n-type concentration level greater than $1 \times 10^{19}$ atoms/cm$^3$, a first vertical structure comprising at least one sidewall extending from said first silicon region, over said second region of strained $Si_{l-x}C_x$ region, over said third region of p-type silicon, over said fourth region of strained $Si_{l-y}C_y$ to said fifth region, a sixth silicon region over a region of said at least one sidewall of said vertical structure, a first gate dielectric region over said sixth silicon region, and a first gate conducting region over said gate dielectric region, a seventh p-type silicon epitaxial region on said first single crystalline substrate having a concentration level greater than $1 \times 10^{19}$ atoms/cm$^3$, an eighth carbon-doped epitaxial region over said seventh p-type silicon epitaxial region having a p-type to a concentration level greater than $1 \times 10^{19}$ atoms/cm$^3$, a ninth silicon epitaxial region over said eighth carbon-doped epitaxial region doped n-type, a tenth compressively strained $Si_{l-w-q}Ge_wC_q$ epitaxial region over said ninth silicon epitaxial region having a p-type concentration level greater than $1 \times 10^{19}$ atom/cm$^3$, an eleventh region selected from a group consisting of single crystalline silicon, poly silicon and poly SiGe over said tenth $Si_{l-w-q}Ge_wC_q$ region having a p-type concentration level greater than $1 \times 10^{19}$ atoms/cm$^3$, a second vertical structure comprising at least one sidewall extending from said seventh p-type silicon region, eighth carbon-doped epitaxial region, ninth silicon epitaxial region, tenth compressively strained $Si_{l-s}Ge_wC_q$ epitaxial region, to said eleventh silicon epitaxial region, a twelfth strained $Si_{l-s}Ge_s$ region over a region of said at least one sidewall of said vertical structure, a second gate dielectric region over said twelfth strained $Si_{l-s}Ge_s$ region, and a second gate conducting region over said gate dielectric region.

18. The field effect transistor according to claim 17 further comprising:

a first blanket dielectric layer over and above said first vertical structure, a first conducting via through said first blanket dielectric layer in contact to said first n-type silicon region, a second conducting via through said first blanket dielectric layer in contact to said fifth region at the top of said first vertical structure, a third conducting via through said first blanket dielectric layer in contact to said first gate conducting region, a second blanket dielectric layer over and above said second vertical structure, a fourth conducting via through said second blanket dielectric layer in contact to said seventh p-type silicon epitaxial region, a fifth conducting via through said second blanket dielectric layer in contact to said eleventh p-type silicon containing region at the top of the above vertical structure, a sixth conducting via through said second blanket dielectric layer in contact to said second gate conducting region, and a third dielectric region on said first substrate in between said first and second vertical structures to provide device isolation.

19. The inverter according to claim 18 wherein said fourth conducting via is coupled to said first conducting via, said sixth conducting via is coupled to said third conducting via and said fifth conducting via is coupled to said second conducting via by way of conducting material.

20. The inverter according to claim 17 wherein said sidewall of said first vertical structure is in the plane (100), and perpendicular to a major surface of said substrate.

21. The inverter according to claim 17 wherein said sidewall of said second vertical structure is in the plane (110), and perpendicular to a major surface of said substrate.

22. The inverter according to claim 17 wherein said twelfth strained SiGe region is a silicon region.

23. An inverter comprising:

a first relaxed $Si_{l-i}Ge_i$ epitaxial region on a first single crystalline substrate said first $Si_{l-i}Ge_i$ epitaxial layer doped n-type to a concentration level greater than $1 \times 10^{19}$ atoms/cm$^3$, a second tensile strained silicon epitaxial region over said first p-type $Si_{l-i}Ge_i$ region, said second silicon epitaxial region doped n-type to a concentration level greater than $1 \times 10^{19}$ atoms/cm$^3$, a third relaxed $Si_{l-i}Ge_i$ epitaxial region over said second silicon region, said third silicon epitaxial region doped p-type, a fourth tensile strained silicon epitaxial region over said third p-type $Si_{l-i}Ge_i$ region, said fourth strained silicon region doped n-type to a concentration level greater than $1 \times 10^{19}$ atoms/cm$^3$, a fifth region selected from a group consisting of relaxed $Si_{l-i}Ge_i$, poly silicon and poly SiGe over said fourth n-type strained silicon region, said fifth $Si_{l-i}Ge_i$ region doped n-type to a concentration level greater than $1 \times 10^{19}$ atoms/cm$^3$, a first vertical structure comprising at least one sidewall extending from said first relaxed SiGe region, over said second strained silicon epitaxial region, over said third p-type relaxed $Si_{l-i}Ge_i$ epitaxial region, over said fourth strained silicon epitaxial region to said fifth region, a sixth strained silicon region over a region of said at least one sidewall of said first vertical structure, a first gate dielectric region over said sixth silicon region, and a first gate conducting region over said gate dielectric region, a seventh p-type silicon epitaxial region on a first single crystalline substrate having a concentration level greater than $1\times10^{19}$ atoms/cm$^3$, an eighth carbon-doped epitaxial region over said seventh p-type silicon epitaxial region having a p-type to a concentration level greater than $1\times10^{19}$ atoms/cm$^3$, a ninth silicon epitaxial region over said eighth carbon-doped epitaxial region doped n-type, a tenth compressively strained $Si_{l-w-q}Ge_wC_q$ epitaxial region over said ninth silicon epitaxial region having a p-type concentration level greater than $1\times10^{19}$ atoms/cm$^3$, an eleventh region selected from a group consisting of single crystalline silicon, poly Si and poly SiGe over said tenth $Si_{l-w-q}Ge_wC_q$ region having a p-type concentration level greater than $1\times10^{19}$ atoms/cm$^3$, a second vertical structure comprising at least one sidewall extending from said seventh p-type silicon epitaxial region, eighth carbon-doped epitaxial region, ninth silicon epitaxial region, tenth compressively strained $Si_{l-w-q}Ge_wC_q$ epitaxial region, to said eleventh silicon epitaxial region, a twelfth strained $Si_{l-s}Ge_s$ region over a region of said at least one sidewall of said second vertical structure, a second gate dielectric region over said twelfth strained $Si_{l-s}Ge_s$, region, and a second gate conducting region over said gate dielectric region.

24. The field effect transistor according to claim 23 further comprising:

a first blanket dielectric layer over and above said first vertical structure, a first conducting via through said first blanket dielectric layer in contact to said sixth silicon region in the area on top of said first n-type silicon layer, a second conducting via through said first blanket dielectric layer in contact to said fifth silicon containing region at the top of said first vertical structure, a third conducting via through said first blanket dielectric layer in contact to said first gate conducting layer, a second blanket dielectric layer over and above said vertical structure, a fourth conducting via through said second blanket dielectric layer in contact to said seventh p-type silicon region, a fifth conducting via through said second blanket dielectric layer in contact to said twelfth strained $Si_{l-s}Ge_s$ region in the area over said eleventh p-type silicon epitaxial region at the top of the above said first vertical structure, a sixth conducting via through said second blanket dielectric layer in contact to said second gate conducting region, and a third dielectric region on said first substrate in between said first and second vertical structures to provide device isolation.

25. The inverter according to claim 24 wherein said fourth conducting via is coupled to said first conducting via, said sixth conducting via is coupled to said third conducting via and maid fifth conducting via is coupled to said second conducting via conducting material.

26. The inverter according to claim 23 wherein said sidewall of said first vertical structure is in the plane (100), and perpendicular to a major surface of said substrate.

27. The inverter according to claim 23 wherein said sidewall of said second vertical structure is in the plane (110), and perpendicular to a major surface of said substrate.

28. The inverter according to claim 23 wherein said twelfth strained SiGe region is a silicon region.

* * * * *

UNITED STATES PATENT AND TRADEMARK OFFICE
CERTIFICATE OF CORRECTION

PATENT NO. : 6,943,407 B2  Page 1 of 1
APPLICATION NO. : 10/463039
DATED : September 13, 2005
INVENTOR(S) : Qiqing C. Ouyang et al.

It is certified that error appears in the above-identified patent and that said Letters Patent is hereby corrected as shown below:

Column 7,
Line 11, "NMOSFET" should read -- nMOSFET --.

Column 10,
Line 25, "over the other perimeter" should read -- over the outer perimeter --.

Column 11,
Lines 50 and 51, "$Si_{1-w-q}$" should read -- $Si_{1-w-q}Ge_wC_q$ --.
Line 67, "$Si_{1-s}Ge_wC_q$" should read -- $Si_{1-w-q}Ge_wC_q$ --.

Column 12,
Line 2, "$Si_{1-w-q}Ge_s$" should read -- $Si_{1-s}Ge_s$ --.
Line 33, "Hf Al, Zr, La, Y, Ta" should read -- Hf Al, Zr, La, Y, Ta --.
Line 44, "$10x^{19}$" should read -- $1x10^{19}$ --.
Line 55, "$Si_{1-s}Ge_s$," should read -- $Si_{1-s}Ge_s$ --.

Column 13,
Line 53, "$Si_{1-s}Ge_wC_q$" should read -- $Si_{1-w-q}Ge_wC_q$ --.

Signed and Sealed this

Twentieth Day of June, 2006

JON W. DUDAS
*Director of the United States Patent and Trademark Office*